United States Patent [19]
Smith et al.

[11] Patent Number: 5,646,427
[45] Date of Patent: Jul. 8, 1997

[54] INTEGRATED CIRCUIT DEFECT TOLERANT ARCHITECTURE

[75] Inventors: Charles Russell Smith, Waterloo, Canada; Michael George Farrier, Boyne City, Mich.

[73] Assignee: Dalsa, Inc., Canada

[21] Appl. No.: 518,456

[22] Filed: Aug. 23, 1995

[51] Int. Cl.$^6$ .................................................. H01L 27/148
[52] U.S. Cl. ......................... 257/232; 257/246; 257/249; 257/250
[58] Field of Search ..................... 257/215, 231, 257/232, 246, 249, 250; 377/63

[56] References Cited

U.S. PATENT DOCUMENTS

| | | | |
|---|---|---|---|
| 4,163,239 | 7/1979 | Carter | 257/249 |
| 4,262,297 | 4/1981 | Partridge | 257/249 |
| 4,375,652 | 3/1983 | White | 358/213 |
| 4,870,293 | 9/1989 | Elabd | 250/578 |
| 5,073,808 | 12/1991 | Kinoshita | 257/229 |
| 5,194,751 | 3/1993 | Yonemoto et al. | 257/229 |
| 5,212,503 | 5/1993 | Saito et al. | 257/773 |
| 5,332,917 | 7/1994 | Lee et al. | 257/390 |

OTHER PUBLICATIONS

S.M. Sze, "VLSI Technology", McGraw–Hill, New York, 1983, pp. 604–613, Chap. 14, Yield and Reliability written by W.J. Bertram.
Randall L. Geiger et al., "VLSI Design Techniques for Analog and Digital Circuits", McGraw–Hill, New York, 1990, pp. 19–29.

*Primary Examiner*—Minh-Loan Tran
*Attorney, Agent, or Firm*—Banner & Witcoff, Ltd.

[57] ABSTRACT

A structure for a charge coupled device (CCD) to minimize effects of masking defects of a predetermined dimensional extent includes a plurality of sets of conductors, a plurality of strapping networks and a connection matrix of via contacts. Each set of the plurality of sets of conductors includes a plurality of parallel elongate first conductors oriented in a first direction and disposed substantially in a first plane, each first conductor being comprised of a first material and characterized by a first sheet resistance per square of conductor. Each network of the plurality of strapping networks includes a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance. Each via contact of the connection matrix of via contacts connects a conductor of the plurality of first conductors of one of the sets of conductors with a conductor of the plurality of second conductors of one of the strapping networks, the connection matrix having a first via contact. Distances between the first via contact and each other via contact of the connection matrix are greater than the predetermined dimensional extent while a first lateral spacing between adjacent conductors of the plurality of first conductors is less than the predetermined dimensional extent, and while a second lateral spacing between adjacent conductors of the plurality of second conductors is less than the predetermined dimensional extent.

26 Claims, 8 Drawing Sheets

INTEGRATED CIRCUIT DEFECT TOLERANT ARCHITECTURE

BACKGROUND OF THE INVENTION

1. Field of the Invention

The present invention relates generally to a method and apparatus for design, layout, and processing, and the manufacture of very large area, wafer scale, charge-coupled device (CCD) image sensors and, in particular, to a method and apparatus for improving the manufacturing yield of wafer scale CCD sensors by providing a layout structure which is tolerant to defects bridging between strapping bus lines and defects in polysilicon gate bus lines.

2. Description of Related Art

Charge-coupled device image sensors are fabricated using techniques generally described as large scale integrated (LSI) circuit, very large scale integrated (VLSI) circuit, ultra-large scale integrated (ULSI) circuit, and now wafer scale integrated (WSI) circuit silicon processing. The processing involves application of multiple layers of silicon dioxide, silicon nitride, polysilicon, ion implant, diffusion, and metal layers, each of which is photolithographically patterned to produce silicon integrated circuit devices generally known in the art as metal-oxide-silicon (MOS) devices. Integrated circuits are also fabricated using bi-polar, gallium arsenide (GaAs), and other technologies. The charge-coupled device (CCD) image sensor is fabricated using variations of typical MOS device processing techniques.

During the fabrication of CCD image sensors (as well as all MOS, bi-polar, etc. devices), particulate contamination occurs which manifests itself as deposited or printed artifacts in one or more of the patterned layers. The artifacts are randomly dispersed about the surface area of a substrate. The substrate is a slice of single crystal silicon or other semiconductor material which is generally produced with diameters of four, five, six, or eight inches.

Particulate contamination occurring in the course of processing silicon integrated circuits has a finite density and usually a random distribution about the wafer surface. Particulate contamination occurring during masking steps in the process has a high probability of creating undesired features which bridge a gap between two electrically unrelated conductive layers, creating an electrical short and thus a device failure.

Silicon integrated circuits are generally small in area compared with the area of the substrate. Thus, a multiplicity of devices can be fabricated on a single substrate. The randomly distributed masking defects then impact the device yield of any wafer, being manifested as a percentage of the total surviving devices divided by the total potential devices present on the wafer. The resultant yield generally follows exponential or square law relationships based on the area of the device and the defect density produced during the processing. Clearly, with a predetermined defect density, large area devices will suffer substantially larger yield loss per wafer than will be suffered by smaller area devices.

Many techniques are used in silicon integrated circuit processing to minimize gross shorting yield loss on processed silicon wafers. Generally, the techniques employed concentrate on the reduction of contaminants in the silicon fabrication facility. Reduction of contaminants is accomplished by various means, including filtering and purifying the recirculated laboratory air, filtering processing materials such as photoresists, eliminating human contamination in the laboratory, eliminating dust-generating equipment from the laboratory, etc. Such techniques can reduce contamination-induced defect densities to less than one defect per square inch. In general, for silicon devices with small areas ($A \leq 0.05$ square inches), a defect density of less than 1 defect per square inch will generate a device yield at the wafer level of greater than 85%, which is often acceptable.

Since the defect density in a given silicon wafer processing facility is generally a given quantity, larger area devices ($A \geq 0.3$ square inches) must be designed to reduce the impact of processing defects on yield or suffer high yield loss, resulting in high manufacturing costs. One technique used in circuit layout is to provide redundant circuit elements in the device design which are idle if the device has no defects, but which can be activated through electrical means to bypass a defective circuit element.

Special process steps may also be employed to reduce the impact of defects on the circuit. Process layers, such as polysilicon, metal, contact, etc., may be redundantly patterned to eliminate defects created by a single patterning of that layer. This is effective since randomly (not systematically) dispersed contamination induced defects have a nearly zero probability of being replicated in successive masking steps.

The design of CCD image sensors requires using dense arrays of repeated imaging cells (pixels) with interconnect structures. Such sensors do not allow for circuit redundancy. Additionally, since a CCD image sensor is used as the photosensing element in a fixed format camera system, no active area can be idle or redundant without reducing the performance of the imaging system. Hence, the entire active area of a CCD sensor must be free of defects of the kind that causes shorting failures.

Masking redundancy has been employed successfully in the manufacture of CCD image sensors at a cost of additional processing steps. This technique is limited to layers which have features large enough or with large enough spacing that the application of a second or redundant mask will not ruin the function of the earlier patterned layer. Mask alignment and photoresist dimensional tolerances, as well as etch process tolerances, limit the practice of mask redundancies to lower density device structures. Masking redundancies will not eliminate all forms of defects (e.g., defects causing bridging or shorting of two conductive layers). One example of defects which cannot be eliminated with redundant masking is the occurrence of tall or very thick features which cannot be properly patterned or etched using conventional photolithographic techniques.

For wafer scale CCD sensor designs with dense polysilicon, contact, and metal patterns, the problem of preventing a known process-induced defect density from causing shorting failures cannot be solved with either circuit redundancy or simple mask redundancies. An attempt to fabricate a single, large area, metal strapped, CCD image sensor on one silicon wafer (e.g., 4-inch diameter) by conventional methods will often produce zero yield.

This invention solves the problem enabling a finite yield of short free CCD sensors with a device area comprising more than 85% of the silicon wafer surface, while the measured gross defect density for the process is large compared to that which, without this invention, would be required to predict a finite short free yield. This invention reduces the probability that known defects, resulting from the silicon processing, will cause a fatal short.

In FIGS. 1A and 1B, CCD image sensor pixels of the full frame type are constructed of three polysilicon layers 10

(designated poly 1, poly 2, and poly 3) patterned in repeated contiguous stripes across a lateral dimension of the array. It should be noted that other forms of CCD image sensors, such as interline transfer, frame transfer, and TDI (time delay and integration), may similarly be constructed of multiple layers of patterned polysilicon layers. The polysilicon stripes or buses are commonly used to supply voltages in a clocked square wave pattern to create potential wells and barriers in bulk silicon channels defined by oxide or implanted channel stops. Photogenerated electrons are collected in integration wells and the packets of charge collected therein are transferred by the clocked square wave patterned voltages into a parallel-to-serial register where the charge is transferred to an output device.

In many applications of CCD image sensors that require large imaging focal plane areas or high speed frame transfer or high speed dithering of the potential wells, the resistance of the polysilicon buses must be lowered to reduce waveform propagation delays due to the large capacitances associated with CCD gate structures. A method for reducing the resistivity of the polysilicon bus lines is to pattern metal bus lines 11 in a network transverse to the polysilicon bus lines and contacting each polysilicon bus line to its corresponding metal bus line through via contacts at close intervals 12. The resultant polysilicon bus segments are low in resistance, and the entire array is said to be "metal strapped" or "metal shunted." The metal straps are positioned such that they run the length of the CCD column along a channel stop and comprise as small a fraction of the pixel as possible. Metal coverage in the pixel results in light reflected from the sensor surface and loss of fill factor. Hence the metal coverage is minimized.

In a known implementation of the metal strapping technique, the metal buses are spaced at intervals equaling the pixel pitch (e.g., 12 microns), and the contacts to the polysilicon layers occur at the pixel frequency. Each metal bus is electrically distinct from its neighbor. It is necessary to have metal bus patterns at every channel stop in the array to ensure equal responsivity from each pixel and avoid photoresponse non-uniformities in the array.

Since the metal pattern is an array of closely spaced, electrically distinct conductors, any pattern defects generated during silicon processing, resulting in a metal bridge between metal buses, causes an electrical short between clock phases and ruins the device.

Silicon wafer processing typically generates several masking related defects per square inch. These defects result from numerous sources, including particulate contaminants in the photoresist, contaminants on the wafer surface, contaminants in the deposited materials, handling damage, etc. The sources of masking defects causing fatal shorting failures have been found to be randomly distributed over the surface area of the wafer with only a slight increase in probability at the wafer edges. FIG. 2 illustrates an exemplary wafer scale CCD full frame image sensor comprising >85% of the usable wafer surface (100 mm diagonal wafer). Masking defects 20 are depicted randomly distributed and of a diameter greater than the array pitch (e.g., 12 microns). Masking defects 20 account for nearly all of the fatal shorting defects in the exemplary sensor.

In such a structure of closely spaced metal bus patterns, a defect large enough to span an pixel (e.g., 12 microns) has a 100% probability of creating a short between the otherwise electrically distinct bus lines.

In FIG. 3, several different types of short-causing defects are illustrated. Metal bridging defects 30 comprise excess metal shorting between adjacent metal straps. Defect type 30 constitutes the cause of about 50% of the fatal CCD defects. Other conductive contaminants 31 may also cause shorting between adjacent metal straps. Voids 32 in the insulating oxide layer between the metal and the underlying polysilicon layers may coincide with multiple polysilicon bus lines causing a metal strap to erroneously contact two or more polysilicon bus lines. Defect types 31 and 32 constitute the causes of about 10% of the fatal CCD defects. Large defects in the polysilicon layer may be contacted through multiple metal via contacts from electrically distinct bus metal layers 33. Defect type 33 constitutes the cause of about 30% of the fatal CCD defects. The remaining 10% of the fatal CCD defects are caused by other more obscure factors.

It is conventionally accepted that these and other forms of contaminant-induced masking defects cannot be eliminated from the typical CCD, MOS, CMOS, bi-polar, etc. fabrication processes. For devices with small active areas, the typical masking defect densities result in a reduction in the net yield of functional devices per fabricated wafer. In the case of the wafer scale CCD sensor, normal defect densities result in zero yield since there is only one device per wafer.

FIG. 4 illustrates a calculated curve fit for the yield of the exemplary wafer scale CCD sensor. The curve 40 indicates that there is an exponential relationship to the yield of $Y=e^{-AD}$, where D is the defect density in defects per square inch, and A is the area of the sensor in square inches. The defect density for an exemplary device is 1.3 defects per square inch. The yield for a wafer scale device with an area of about 2 square inches for that defect density is <0.06%. This is manifested by the fact that each bridging defect has a 100% probability of causing a fatal short in this structure. The present invention reduces the probability that a fatal short will result from a bridging defect.

SUMMARY OF THE INVENTION

It is an object to the present invention to overcome limitations in the prior art. It is a further object of the present invention to provide a layout structure for a wafer scale integrated CCD sensor which can tolerate bridging defects without failing. It is a further object of the present invention to provide a layout structure for a wafer scale integrated CCD sensor which can tolerate polysilicon defects of the type described herein without failing.

These and other objects are achieved in a structure for a charge coupled device (CCD) to minimize effects of masking defects of a predetermined dimensional extent which includes a plurality of sets of conductors, a plurality of strapping networks and a connection matrix of via contacts. Each set of the plurality of sets of conductors includes a plurality of parallel elongate first conductors oriented in a first direction and disposed substantially in a first plane, each first conductor being comprised of a first material and characterized by a first sheet resistance per square of conductor. Each network of the plurality of strapping networks includes a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance. Each via contact of the connection matrix of via contacts connects a conductor of the plurality of first conductors of one of the sets of conductors with a conductor of the plurality of second conductors of one of the strapping networks, the connection matrix having a first via contact. Distances between the first via contact and each other via contact of the connection matrix are greater than the predetermined dimensional extent while a first lateral spacing between adjacent conductors of the plurality of first conductors is less than the predetermined dimensional extent, and while a second lateral spacing between adjacent conductors of the plurality of second conductors is less than the predetermined dimensional extent.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

An exemplary embodiment of a three-phase wafer scale integrated CCD imaging sensor will be described.

Figure 5:
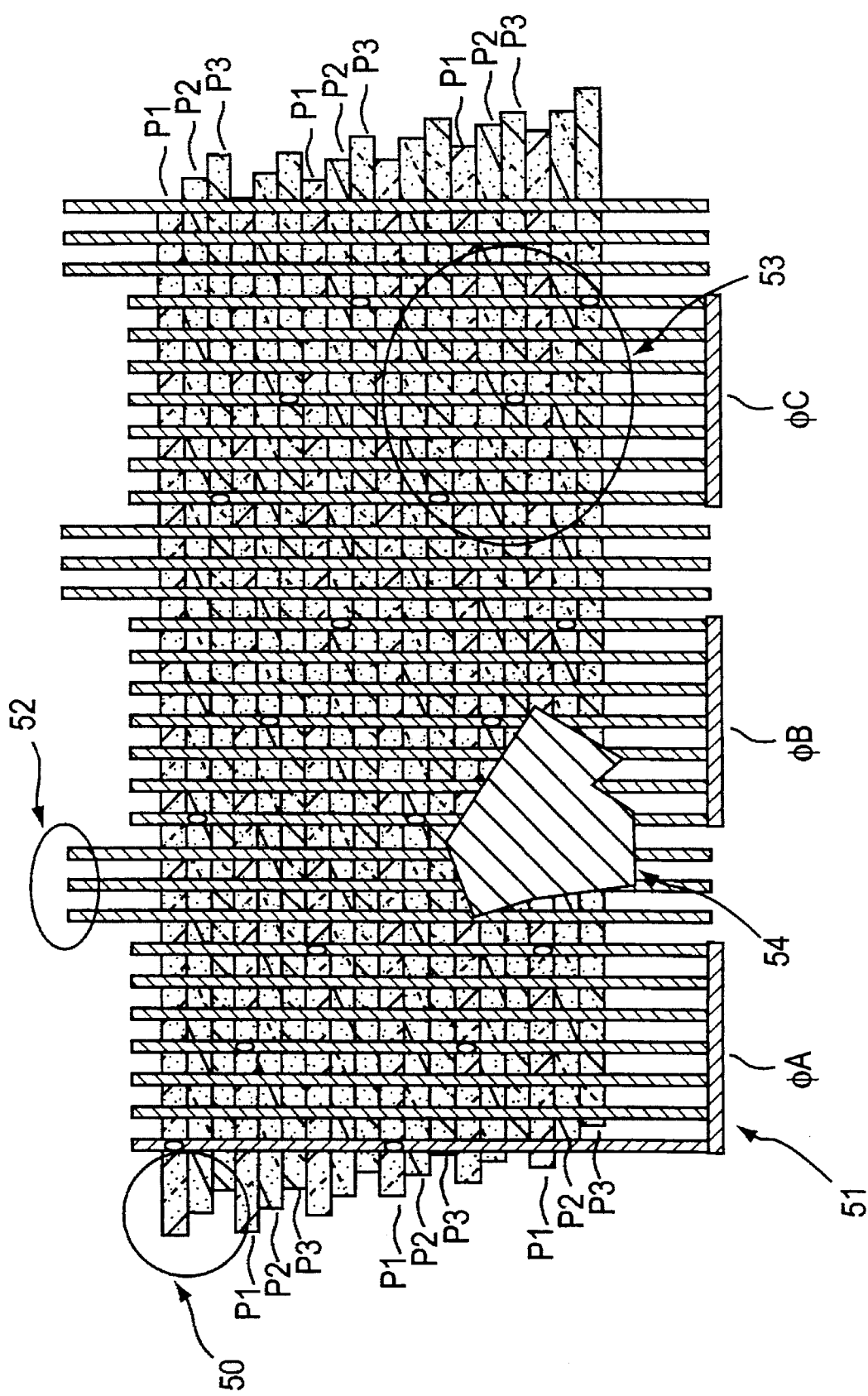
FIG. 5 is a schematic drawing of a metal strapping structure according to the present invention.

In FIG. 5, a new layout of metal bus lines and contacts is shown. The three-phase polysilicon gate structure 50 (each phase designated P1, P2, P3, respectively) is unaltered from the prior art. Thus, six shift register elements are depicted in a vertical arrangement in FIG. 5.

Figure 1A:
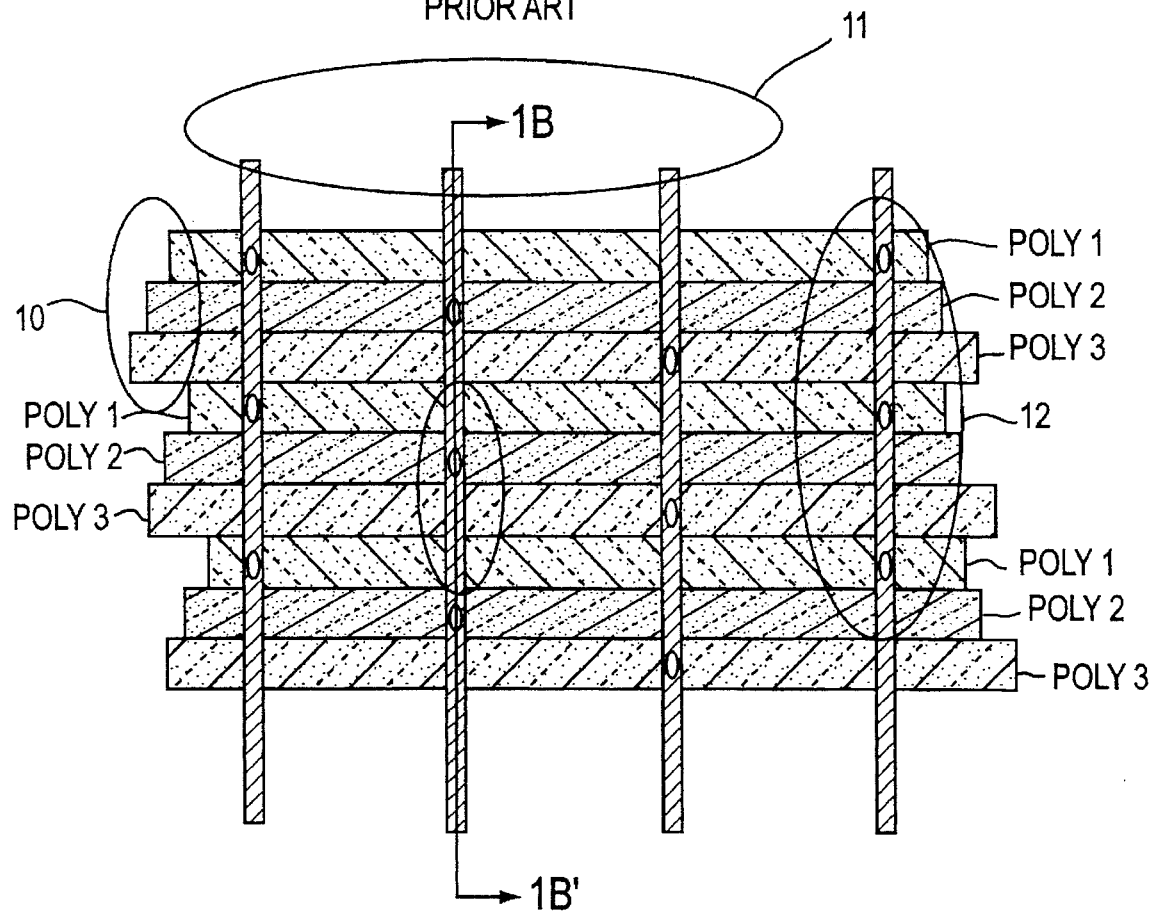
FIGS. 1A and 1B are schematic and sectional drawings of a conventional metal strapping structure.
Figure 1B:
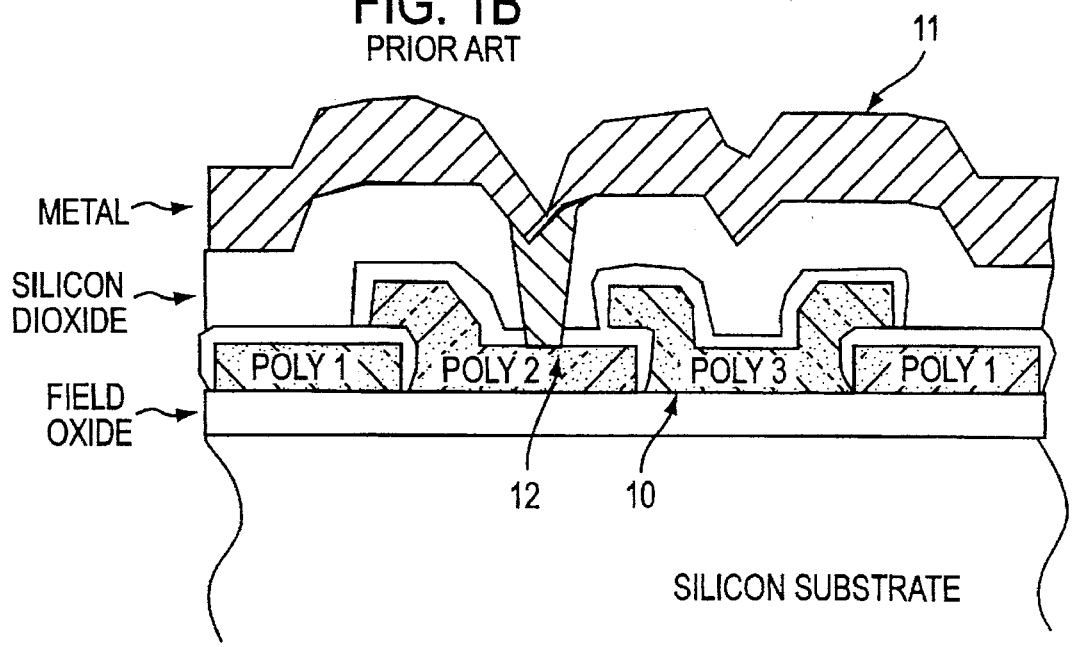
Figure 2:
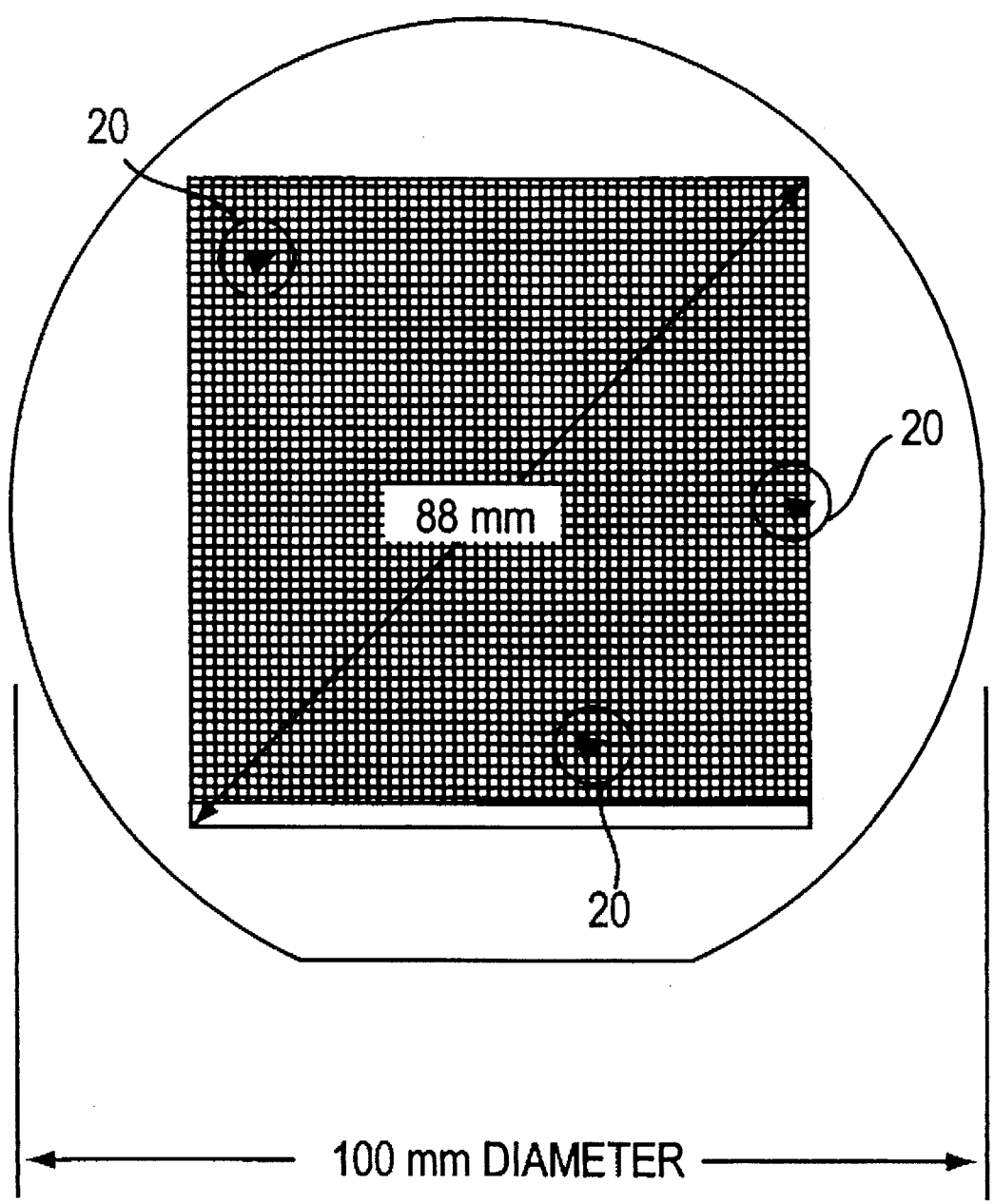
FIG. 2 is a topographical drawing of a layout of a wafer scale integrated circuit on a wafer.

The three-phase polysilicon gate structure is formed by a sequence of processing steps. First, a polysilicon film is deposited on the wafer and then defined (e.g., by patterned etching) to form polysilicon bus lines P1. Then, an oxide layer is formed over polysilicon bus lines P1. Second, another polysilicon film is deposited on the wafer and then defined to form polysilicon bus lines P2. Then, another oxide layer is formed over polysilicon bus lines P2. Third, another polysilicon form is deposited on the wafer and then defined to form polysilicon bus lines P3. Bus lines P1, P2, and P3 are disposed parallel to, and interlineated with, each other. Thus, bus lines P1, P2, and P3 are disposed substantially is a single plane; however, bus lines P1, P2, and P3 are not exactly co-planar. As shown in FIG. 1B, portions of poly 2 (i.e., corresponding to P2) insulatively overlap poly 1 (i.e., corresponding to P1), and separate portions of poly 3 (i.e., corresponding to P3) insulatively overlap poly 1 and poly 2. Thus, polysilicon bus lines P1, P2, and P3 are electrically distinct so that a separate clock phase may be coupled to each polysilicon layer.

In this three-phase bus line structure, it is particularly important to note that large bridging defects in a polysilicon layer cannot short P1 to P2, P2 to P3 or P3 to P1 due to the intervening insulation layer (e.g., oxide insulation layer, see FIG. 1B). A large bridging defect, for example, in polysilicon layer P2, merely couples one polysilicon bus line P2 to a next adjacent polysilicon bus line P2, both of which carry the same electrical signal anyway. Thus, no fatal failure occurs since polysilicon layer P2 is insulated from polysilicon layers P1 and P3 and does not cause a phase-to-phase short. If a bridging defect in, for example, polysilicon layer P2 were to be sufficiently large to extend to an area through which a via contact is disposed to contact a different polysilicon layer (e.g., polysilicon layer P1 or P3), then a fatal defect might occur of the type depicted as 33 in FIG. 3.

Whereas, polysilicon layers P1, P2, and P3 are not disposed exactly in a single plane, it is convenient to refer to the polysilicon layers as being disposed substantially in a first plane so as to help define their spatial relationship with respect to metal bus lines 51 which are disposed substantially in a second plane insulatively spaced apart from the first plane. However, as depicted in FIG. 1B and as described above, each of the polysilicon layers P1, P2, and P3 are formed in sequential processes and actually form a three dimensional topography. For example, polysilicon bus lines may overlap each other or be disposed in a tiered (e.g., stair step) structure. However, such three dimensional topography is referred to herein as substantially planar to help define the relationship with respect to the metal bus lines.

Layout features in FIG. 5 include grouped (commoned) metal bus lines (i.e., strapping lines) 51, "floating" metal bus lines 52 spaced between the common metal line groups, and the reduced density of metal to polysilicon via contacts 53 within the common metal line groups. These features greatly reduce the probability that masking-induced defects will create a fatal short between electrically distinct clock lines.

Metal bus lines 51 and 52 are preferably disposed over channel stop regions of the CCD shift registers (depicted as being oriented vertically in FIG. 5). This is because photosensitive regions of a CCD sensor are confined between channel stops and it is desirable that the metal bus lines be disposed in regions other than the photosensitive regions since the metal bus lines would tend to block, shadow, or diminish the light intensity impinging on photosensitive regions if disposed over the photosensitive region. This would then diminish the responsivity of the photosensitive region.

Even though the metal bus lines are disposed over the channel stop regions, there may be some reduction in light impinging the photosensitive region due to alignment variation or, for example, if the width of the metal bus lines exceeded the width of the channel stop regions.

Grouped metal bus lines 51 form a network for each phase of the clocking voltages depicted as $\phi A$, $\phi B$ and $\phi C$ in FIG. 5. Since all metal bus lines in a single network carry the same signal, bridging shorts between metal bus lines in the same network will not cause a fatal short circuit with an electrically distinct metal bus line.

To reduce the probability of a fatal failure from a bridging defect in the metal conductor layer, grouped metal bus lines 51 for each phase $\phi A$, $\phi B$, and $\phi C$ are spaced apart so that a lateral space between adjacent networks of grouped metal bus lines is greater than a dimension of the bridging defect. A CCD photo detector includes a regular array of photosensitive regions. Since, as discussed above, the metal bus lines may tend to cast a shadow over the photosensitive regions, it is necessary to provide a regular array of metal bus lines so that each photosensitive region will suffer identical shadowing, if any. Therefore, since the networks of grouped metal bus lines 51 are spaced apart to tolerate metal bridging defects of substantial extent, it is necessary to dispose "dummy" or "floating" metal bus lines 52 in the spaced apart region. These "floating" bus lines 52 provide "shadowing" effects identical to the effects provided by grouped metal bus lines 51 so that the CCD sensor exhibits a uniform responsivity over the entire array of photosensitive regions. "Floating" bus lines 52 are preferably connected to nothing except that, in the event that a metal bridging defect exists, a "floating" bus line 52 may become harmlessly connected to an adjacent grouped metal bus line 51.

"Floating" metal bus lines 52 may alternatively be connected to bonding pads disposed on opposite sides of the imaging area of the CCD sensor and used to pass a signal in the metal layer through the imaging area. Once the wafer scale integrated CCD sensor is fabricated and tested, "floating" metal bus lines 52 which are not otherwise connected to grouped metal bus lines 51 (i.e., via metal bridging defects) may be used to connect other first and second circuit elements on opposite sides of the imaging area using, for example, wire bonding techniques between bonding pads connected to the "floating" metal bus lines 52 and bonding pads connected to the first and second circuit elements.

"Floating" metal bus lines 52 may be used alternatively to connect the first and second circuit elements disposed on opposite sides of the array of photodetector pixels using redundancy control circuits. If one of the grouped metal bus lines 51 were to become connected to one or more of "floating" metal bus lines 52 (e.g., as a result of a bridging defect 54), then known redundancy control circuitry would be used to isolate or "float" the connected "floating" metal bus line 52 and reroute any signals carded thereon over a redundant "floating" metal bus line that is not electrically connected to the grouped metal bus line 51. However, the invention does not rely on redundancy control circuits to isolate bus line 52 since bus line 52 is provided so as to be electrically isolated from bus lines 51.

Considered individually, each of these CCD layout features (i.e., 51, 52, and 53) addresses a different type of defect occurring at different steps in the process. Features 51 and 52 address the gross shorting of electrically distinct metal bus lines which occur at high frequency with close spacing in the prior art. A mask-induced defects 54, which would cause the metal layer to be improperly patterned such that metal was remnant across adjacent bus lines (i.e., a bridging defect), is shown in FIG. 5 to bridge only bus lines of a common electrical origin and metal bus lines which are electrically disconnected (i.e., floating). This defect, which would have caused a fatal short in CCD designs using the prior art, causes harmless bridging connections to common electrical bus lines and to disconnected bus lines. Thus, while the incidence of the defect from the CCD processing has not been reduced, the probability that it will result in a shorting failure is greatly minimized. Since experience has shown that the majority of the bridging defects (e.g., defects 30, 31 in FIG. 3) have diameters of 48 microns or less, the spacing of electrically distinct metal buses at 48 microns offers a significant reduction in the probability that a metal bridging defect will create a fatal short. Three electrically distinct "floating" bus lines 52 (on 12 micron centers) are preferably provided in 48 micron spaces between adjacent networks of grouped metal bus lines 51. Some small fraction of the normal masking defects is larger than 48 microns, and those defects still have a 100% probability of creating a shorting defect.

The metal grouping pattern is additionally enhanced for effectiveness by using a technique known in the art as redundant masking and etching. Thus, a metal layer is deposited, and a first metal layer mask is patterned and etched, resulting in a quantity of randomly occurring bridging defects. A second metal mask layer having identical patterns but slightly larger features is applied, and the layer is again etched. The probability of two otherwise randomly occurring defects aligning exactly is almost non-existent. Hence, the second metal mask and etch process opens or corrects the bridging defect in the pattern from the first application of the mask and etch process. This technique is quite effective for bridging defects which are not tall, that is, for defects which do not extend vertically above the surface greater than the photoresist thickness (approximately 2 microns). Tall defects tend to cause puddling of photoresist, improper exposure, and incomplete etching, such that the redundant masking does not clear the original bridging defect.

Insulation defect 32 (FIG. 3) is less common than metal bridging defect 30 or polysilicon layer defect 33. If there exists a gap in insulation coverage (typically ranging in size between 10 microns and 100 microns) over which a metal bus line is formed, an unintended via contact is formed between the metal bus line and an underlying polysilicon bus line (i.e., electrode). The spacing of intended via contacts has no effect on the occurrence or effect of insulation defect 32. Since the occurrence of insulation defect 32 is comparatively rare, often protective structure modifications or process modifications are not warranted for its elimination. However, when warranted, a redundant contact etch technique can be used to substantially eliminate the occurrence of this defect type. Alternatively, increasing the spacing between adjacent metal bus lines to about twice the defect size will improve the yield.

Figure 3:
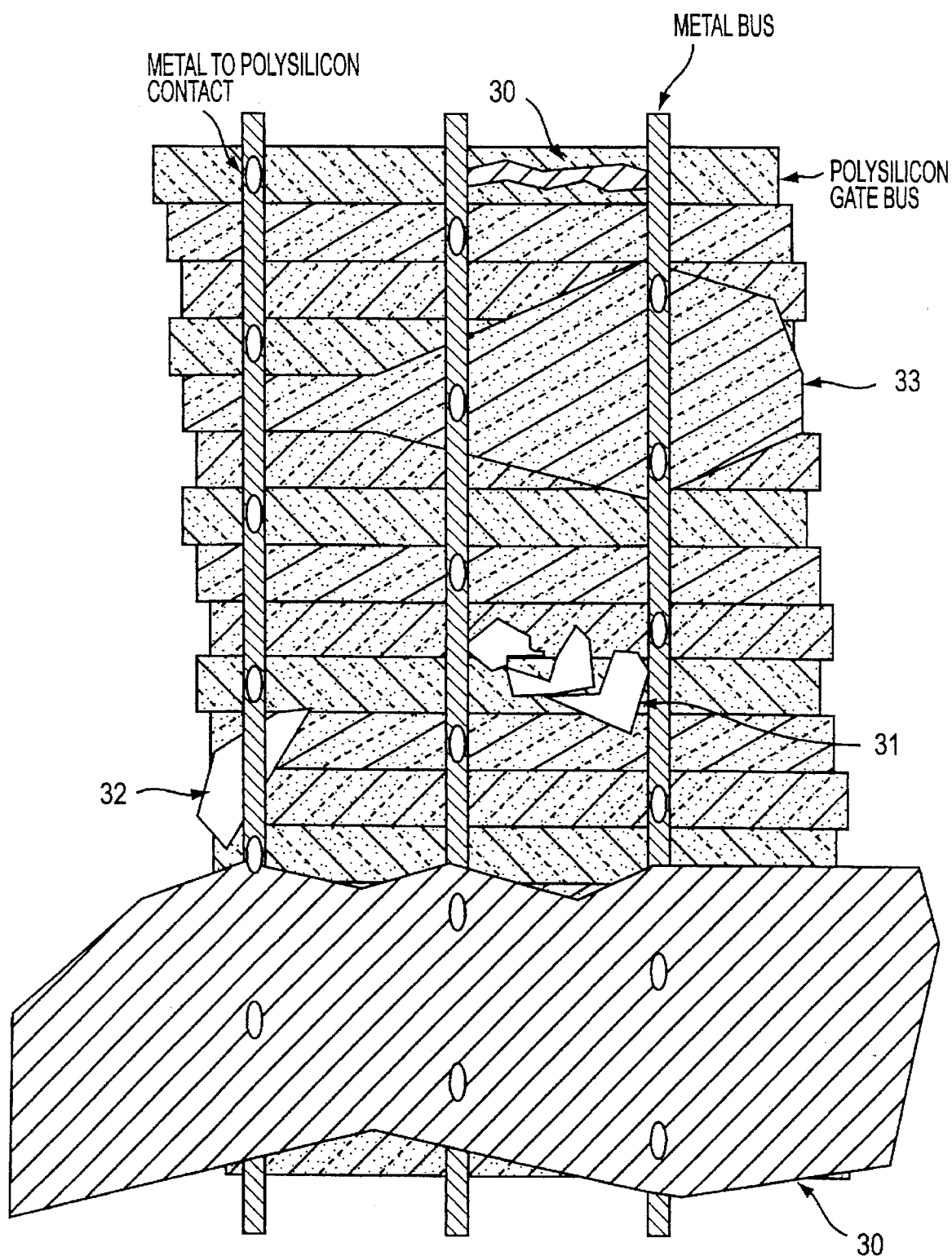
FIG. 3 is a schematic drawing of a conventional metal strapping structure depicting defects fatal to the operation of the conventional metal strapping structure.

The reduced contact density 53 addresses the probability that a large polysilicon defect, such as large polysilicon layer defect 33 shown in FIG. 3 will be coincident with a via contact (e.g., 12 in FIG. 1) of the wrong electrical connection. Similar to metal bridging defects, the polysilicon layer defect would need to be larger than a predetermined dimension (e.g., 48 microns) to be coincident with via contacts from two electrically distinct bus lines.

Thinned via contacts are spaced so that no via contact is closer than a predetermined distance (e.g., 48 microns) from any other via contact, the predetermined distance corresponding to a maximum dimension of a polysiticon layer defect (i.e., 33 in FIG. 3) beyond which defects are extremely unlikely. The predetermined distance for a polysilicon layer defect is not necessarily the same as for a metal bridging defect.

In the exemplary array depicted in FIG. 5, via contacts on a single metal bus line are made to connect to the proper phase polysilicon bus line (of the three phases) in only one out of every three CCD register elements (depicted in a vertical arrangement in FIG. 5). In the preferred embodiment, each of the three polysilicon bus lines is 4 microns wide, a register element therefore extending over 12 microns. Since a via contact from a metal bus strap is made to only one out of every three register elements, the via contacts are spaced on 48 micron centers along the metal bus line. Increasing the separation of via contacts to 1.5 to 2 times the defect size provides protection up to about 80% from this type of defect.

The networks of grouped metal bus lines 51 for the particular phase contains three metal bus lines, each bus line connecting to a different one-third of the CCD register elements which are to be driven. FIG. 5 depicts three networks of grouped metal bus lines, each network corresponding to a different phase so that all phases of the CCD shift register are properly driven. Sets of the three network (corresponding to the three phases) may be repeated along the length of polysilicon bus lines. The networks are spaced apart by a predetermined distance (e.g., 48 microns) through which "floating" bus lines may be provided.

In FIG. 5, via contacts are shown as connected to only one out of every three metal conductors of strapping network 51. In the present exemplary embodiment, the pitch of the array of photosensitive regions is 12 microns. Therefore, channel stop regions are disposed on 12 micron intervals and metal bus lines are disposed over the channel stop regions, also on 12 micron intervals. By ensuring that only one out of three metal bus lines are metal bus lines are connected to via contacts, the via contacts are spaced at least 48 microns apart in the elongated direction of the polysilicon bus lines. By ensuring that a metal bus line has via contacts that connect to a phase conductor of only one CCD register element out of three elements, the via contacts are spaced at least 48 microns apart in the elongate direction of the metal bus line. Thus, this structure can tolerate polysilicon layer defects (i.e., 33 in FIG. 3) with a dimension of up to 48 microns (i.e., three times the pitch of the pixel array). Persons skilled in the art will appreciate, in light of these teachings, how to modify this structure to adapt to different defect sizes or to adapt to different pixel array pitches, or both.

In the preferred embodiment, a three-phase CCD structure is provided. In this embodiment, each of the three polysilicon layers are insulated from each other so that even if, for example, polysilicon bus line P2 were to be erroneously formed at 5 times its design width, it would not short circuit (i.e., bridging defect) to either polysilicon bus line P1 or P3 due to the insulation layers. This is not necessarily true for four-phase CCD structures. In some four-phase CCD structures, phases 1 and 3 are first formed by depositing a polysilicon layer then defining the separate bus lines by etching. Then an insulation layer is provided followed by the formation of phases 2 and 4. In this four-phase CCD structure, it is possible to create a polysilicon bridging defect between either phases 1 and 3 or alternatively between phases 2 and 4. This additional defect type is not present in the three-phase structure of the preferred embodiment and is not reflected in the graph of FIG. 7.

As depicted in FIG. 5, in metal strapping network 51 (i.e., grouped metal bus lines) for φA, there are four metal bus lines depicted without any via contacts. These bus lines are nevertheless provided where shown so that the array of pixels will have a uniform distribution of responsivity to impinging light. Persons skilled in the art will appreciate that FIG. 5 depicts 29 CCD shift registers, each shift register being comprised of six elements shown in FIG. 5 in a vertical arrangement. Polysilicon bus lines P1, P2, and P3 are clocked to transfer charge packets from element to element when sequentially driven. Beneath the metal bus lines depicted in FIG. 5 is disposed channel stop regions which isolate charge packets carried in adjacent CCD shift registers of the 29 CCD shift registers.

In a preferred embodiment, many more than 29 CCD shift registers are incorporated in the wafer scale integrated CCD sensor, and each shift register is comprised of many more than 6 shift register elements. The four metal bus lines in metal strapping network 51 for φA of FIG. 5 that are shown as unconnected to via contacts may advantageously be connected to via contacts formed in other regions of a larger wafer scale integrated CCD sensor. An exemplary larger CCD sensor may comprise plural CCD shift registers where each shift register includes, for example, 1024 shift register elements where only six such elements are shown in FIG. 5. Other shift register elements which would have to be shown in FIG. 5 at locations beyond the top of FIG. 5 are advantageously connected by via contacts to the four metal bus lines in metal strapping network 51 for φA that are shown as unconnected to via contacts in FIG. 5. Similarly, an exemplary larger CCD sensor may comprise 1024 CCD shift registers where only 29 are shown in FIG. 5. Other shift registers which could have to be shown in FIG. 5 at locations beyond the right or beyond the left of FIG. 5 may be advantageously provided with additional sets (e.g., for φA, φB, and φC) of metal strapping networks.

Even though the probability of shorting defects is reduced, the large bridging defects can still cause imaging artifacts, such as non-responsive pixels, and loss of transfer efficiency in the CCD channel. These imaging artifacts are generally considered acceptable performance degradations, while electrical shorting always results in an unusable device.

The purpose of the metal bussing structure on the wafer scale CCD device is to reduce the series resistance of the polysilicon bus lines so as to allow for higher clock frequencies to be used in operating the device. High polysilicon series resistance, combined with very high capacitive loading from the polysilicon gate structures, creates large RC time constants and significant propagation delays for clock pulses fed from the end of a long polysilicon bus line.

The present invention increases the series resistance of the polysilicon gate bus structure fractionally over a prior art strapping bus line structure without thinned via contacts, but the spacing of the common metal bus groupings and contacts is designed such that the resulting distributed RC time constant is only slightly higher than in the CCD designs using the prior art.

Figure 4:
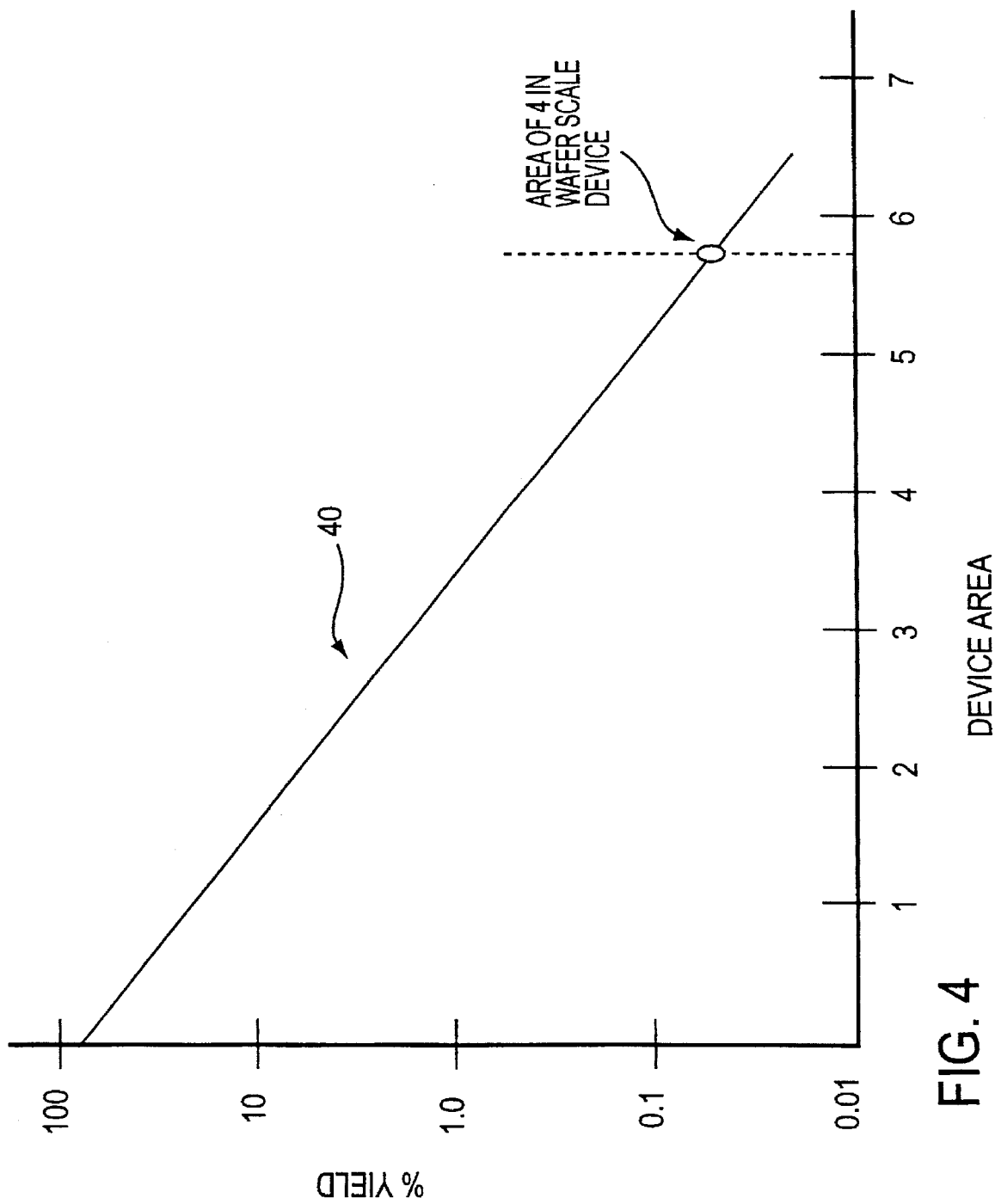
FIG. 4 is a graph depicting the relationship between yield and device area.
Figure 6:
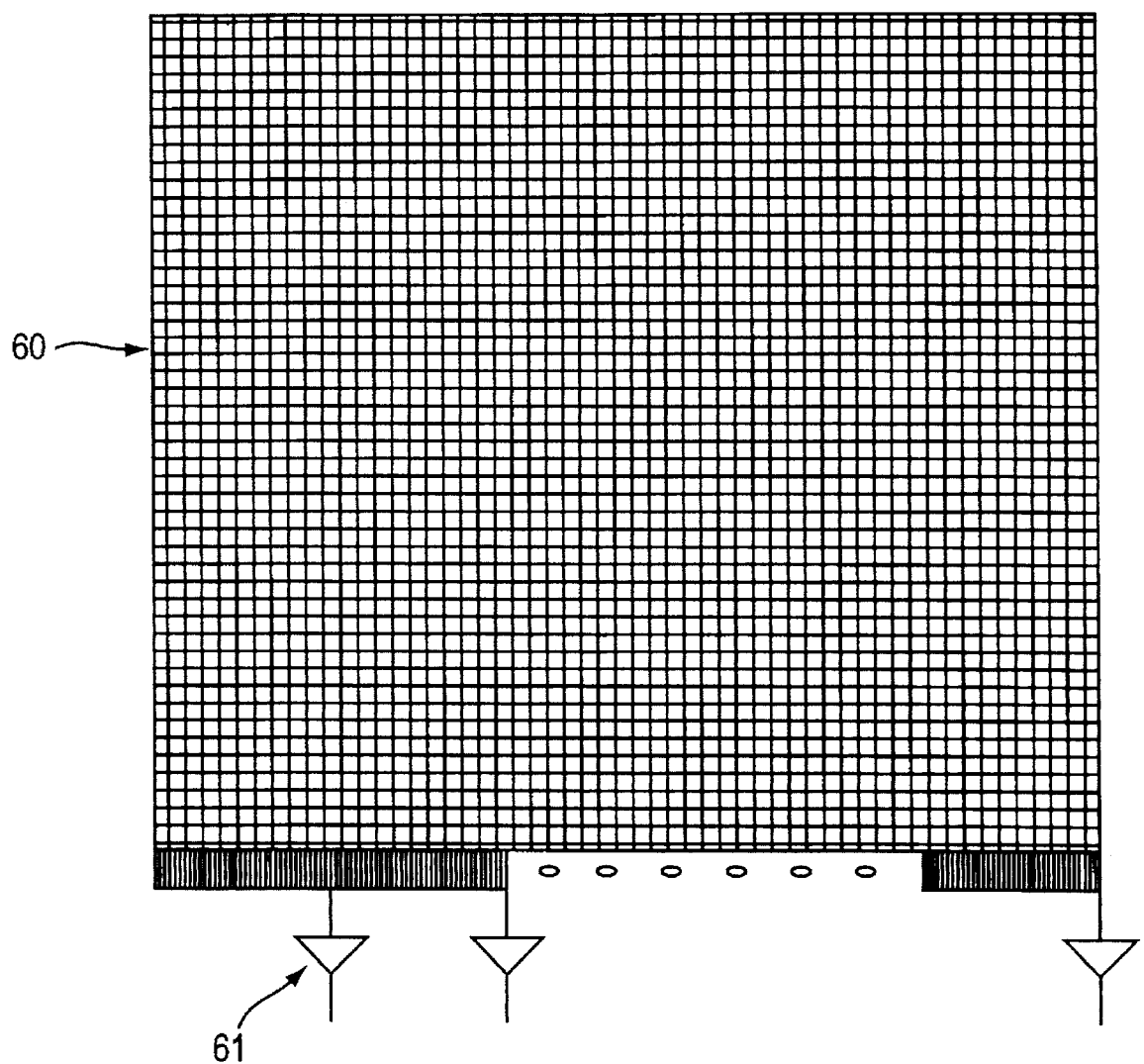
FIG. 6 is a layout of a wafer scale integrated circuit.

In FIG. 6, the present exemplary embodiment (i.e., using a three-poly, three-phase, one-poly-per-phase structure) of the invention is implemented on a full frame transfer CCD image sensor 60, comprised of approximately 25 million pixels, measuring 88 mm in diagonal, and containing multiple output amplifiers 61. However, the invention is not limited to this form of CCD image sensor, but may be incorporated into all large area CCD image sensor designs. Statistical data for FIGS. 4 and 7 were obtained from measurements on the device described in FIG. 6.

Figure 7:
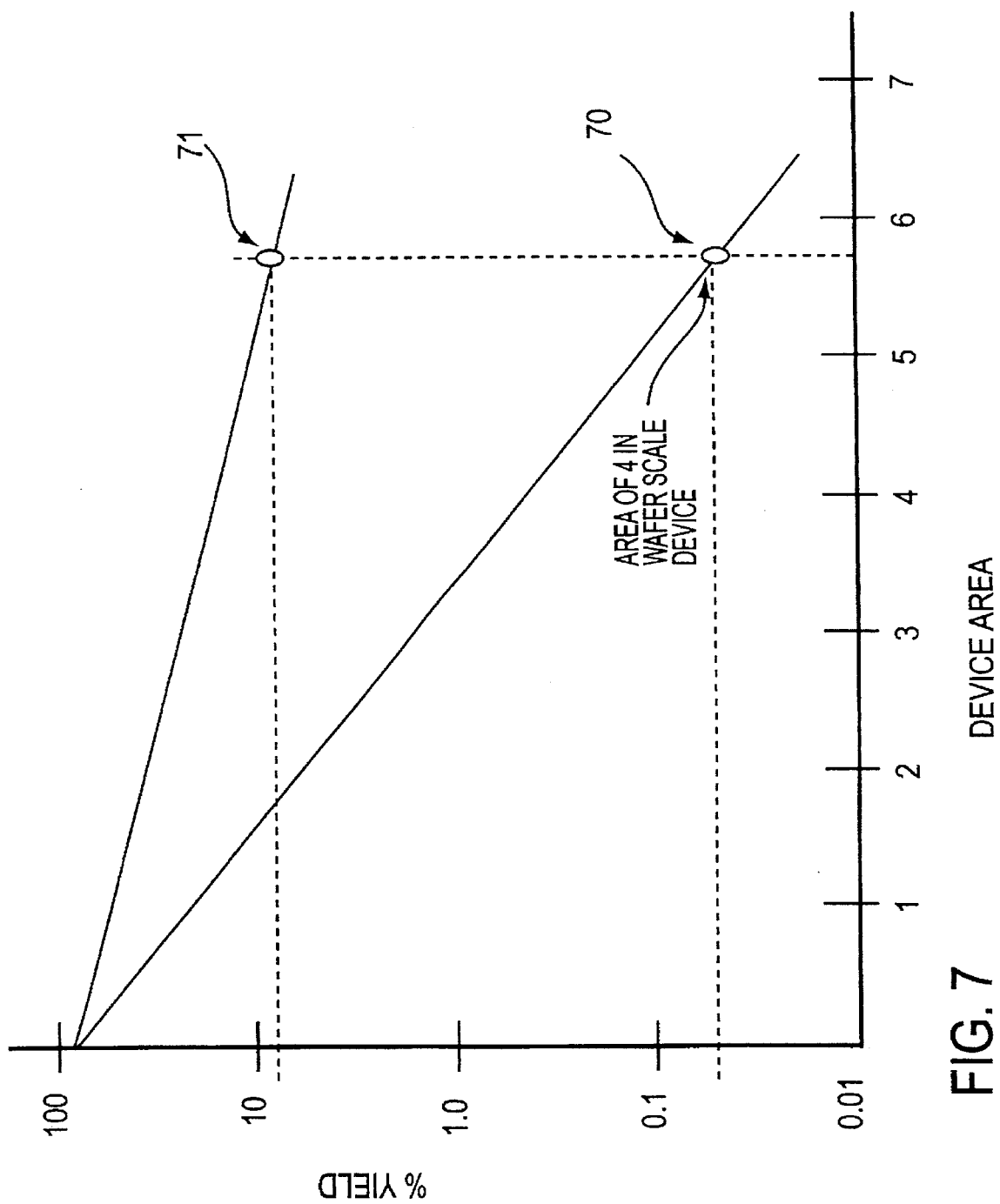
FIG. 7 is a graph depicting a comparison of the relationship between yield and device area for a conventional device and a device according to the present invention.

In FIG. 7, yield dam (for a three-poly, three-phase, one-phase-per-poly structure) indicates the improvement in yield for a wafer scale integrated CCD sensor resultant from the reduction in the probability of a masking defect causing a fatal electrical short due to the present invention.

The empirically calculated yield figures of $Y=0.86e^{-AD}$ where A is the area of the device and D is the density of defects which cause fatal electrical shorts. The active area of the exemplary device is 5.7 square inches. The best fit of the yield curve indicates that the fatal defect density is 1.3 defects per square inch. The defect density D is now composed of $D=d\beta$ where d is the defect density without the improvements taught by the invention, and $\beta$ is the probability that the masking defect will cause a fatal short.

The invention causes $\beta$ to be reduced from 1 to a fraction, based on the nature of the masking device, pitch of the critical structures, and the spacing of the grouped metal buses, contacts, and underlying structural layers.

FIG. 7 indicates the calculation of the yield for the case where $\beta=1$ prior to the application of the invention 70, and for 62 =0.33 in the case of the exemplary embodiment of the invention 71. The resultant improvement in yield is from 0.06% to 8% or a 132 times increase in yield.

Figure 8:
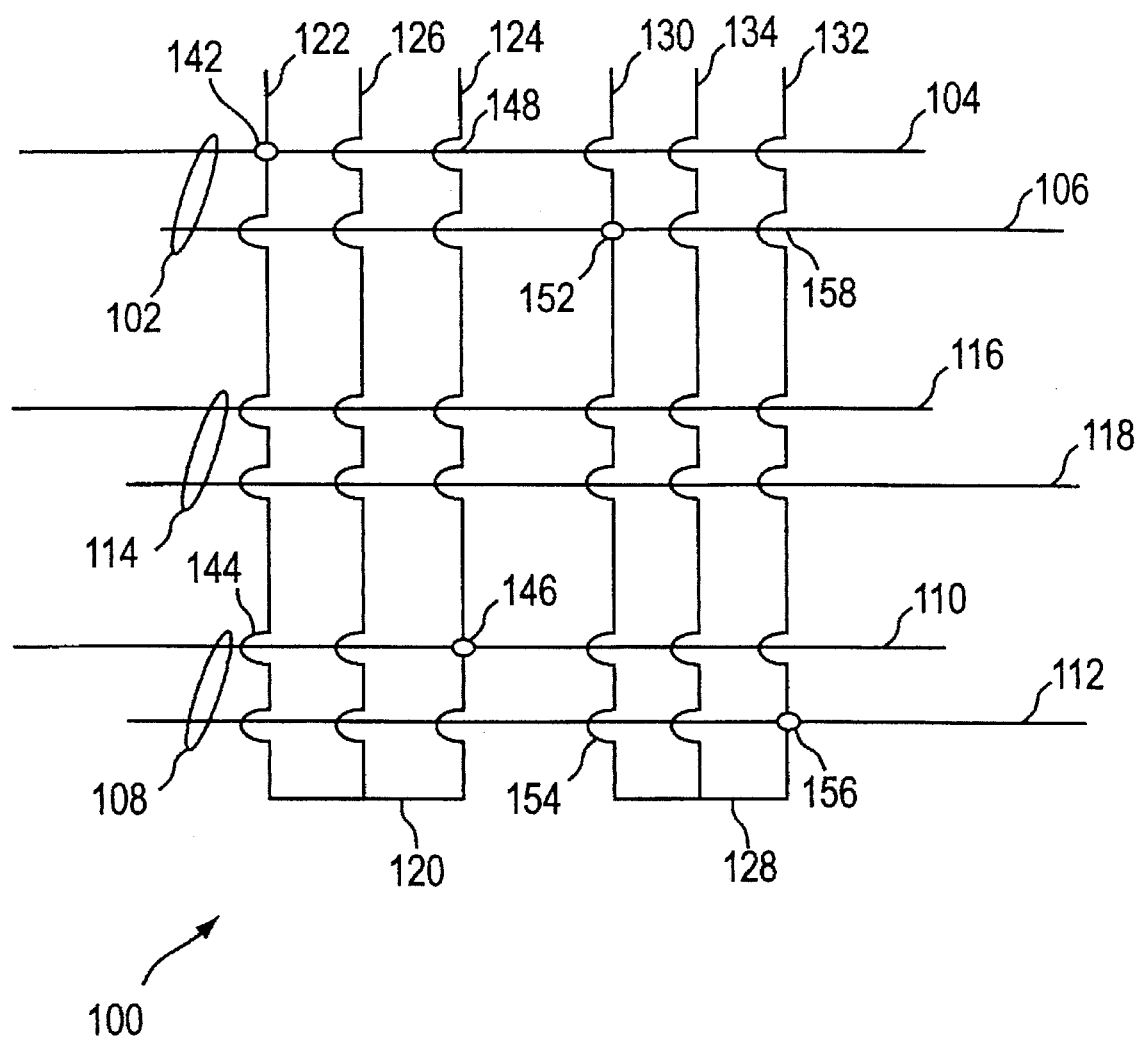
FIG. 8 is a schematic of a simplified exemplary embodiment of the invention.

FIG. 8 is a schematic of a simplified exemplary embodiment of the invention. In FIG. 8, structure 100 for a charge coupled device (CCD) minimizes effects of masking defects of a predetermined dimensional extent. Structure 100 includes a plurality of sets of conductors including first, second and third sets 102, 108 and 114, respectively. There are as many sets as there are CCD register elements to be shifted. Each set of conductors includes a plurality of parallel elongate electrically isolated first conductors including first and second phase conductors 104, 106 of the first set, first and second phase conductors 110, 112 of the second set, and first and second phase conductors 116, 118 of the third set. In a preferred embodiment (i.e., using three-phase CCDs), an additional phase conductor is included in each of the first, second, and third sets of conductors 102, 108, and 114. There are as many phase conductors per set of conductors as there are phases in the clocking mechanism for the CCD. Only two phases are shown for clarity; however, in the preferred embodiment, there are three phase conductors per set. Three phase conductors are preferred for wafer scale integration. Each set of conductors are comprised of a plurality of parallel elongate first conductors oriented in a first direction and disposed substantially in a first plane, each first conductor being comprised of a first material (typically doped polysilicon) and characterized by a first sheet resistance per square of conductor.

Structure 100 further includes first and second electrically distinct strapping networks 120, 128. There are at least as many strapping networks as there are phases in the clocking mechanism for the CCD. For example, in the preferred embodiment there are three phases; therefore, there are at least three strapping networks. It will be appreciated that additional strapping networks may be employed to further "strap" a low resistance conductor to the plurality of first conductors at more than one position along the length of the first conductors.

Each strapping network includes a plurality of parallel elongate second conductors including first, second and third strap conductors 122, 124 and 126 of the first strapping network, and first, second and third strap conductors 130, 132 and 134 of the second strapping network. Each strapping network includes a plurality of parallel elongate second conductors oriented in a second direction transverse to the first direction and being disposed substantially in a second plane insulatively spaced apart from the first plane, each second conductor being comprised of a second material (typically deposited aluminum) and characterized by a second sheet resistance per square of conductor, the second sheet resistance being less than the first sheet resistance.

In a first particular embodiment of the invention, the first strap conductor of the first strapping network is connected to the first phase conductor of the first set at intersection 142 and not connected to the first phase conductor of the second set at intersection 144.

In a second particular embodiment of the invention, the second strap conductor of the first strapping network is connected to the first phase conductor of the second set at intersection 146 and not connected to the first phase conductor of the first set at intersection 148.

In a third particular embodiment of the invention, the first strap conductor of the second strapping network is connected to the second phase conductor of the first set at intersection 152 and not connected to the second phase conductor of the second set at intersection 154.

In a fourth particular embodiment of the invention, the second strap conductor of the second strapping network is connected to the second phase conductor of the second set at intersection 156 and not connected to the second phase conductor of the first set at intersection 158.

In a fifth particular embodiment of the invention, the second phase conductor of the first set is connected to the first strap conductor of the second strapping network at intersection 152 and not connected to the second strap conductor of the second strapping network at intersection 158.

In a sixth particular embodiment of the invention, the second phase conductor of the second set is connected to the second strap conductor of the second strapping network at intersection 156 and not connected to the first strap conductor of the second strapping network at intersection 154.

In a seventh particular embodiment of the invention, a lateral space between first and second strapping networks 120, 128 is greater than the predetermined dimensional extent characterizing the largest masking defects (e.g., 48 microns). In this lateral space, additional bus lines may be routed. Preferably the additional bus lines may be selectively decoupled so as to float. Such additional bus lines may be used, for example, as part of a redundancy structure. With this arrangement, bridging defects (e.g., 30 or 31 of FIG. 3) will not be able to cause a short circuit between first and second strapping networks 120, 128.

In an eighth particular embodiment of the invention, third strap conductor 126 is disposed between first and second strap conductors 122, 124 of first strapping network 120, and a lateral space between first and second strap conductors 122, 124 of first strapping network 120 is greater than the predetermined dimensional extent characterizing the largest masking defects (e.g., 48 microns). For example, in a case where the pitch of the array of photodetectors is 12 microns, the second conductors of each strapping network are preferably arranged on 12 micron centers (typically over channel stop regions of CCD shift registers). If the predetermined dimensional extent characterizing the largest masking defect is 48 microns, then first and second strap conductors 122, 124 of first strapping network 120 are preferably spaced 48 microns apart and third strap conductor 126 (and even a fourth strap conductor) may be disposed between first and second strap conductors 122, 124 on the preferred 12 micron spacing interval.

In a ninth particular embodiment of the invention, third set 114 of conductors is disposed between the first and second sets 102, 108, and a lateral space between first phase conductor 104 of first set 102 and first phase conductor 110 of second set 108 is greater than the predetermined dimensional extent characterizing the largest masking defect (e.g., 48 microns). With this arrangement, polysilicon defects (e.g., 34 of FIG. 3) will not be able to cause a short circuit between, for example, via contacts 142 and 146 of FIG. 8.

The invention enables the wafer scale CCD image sensor technology to achieve manufacturability at a cost which can be tolerated by the marketplace.

Having described preferred embodiments of a novel exchangeable hierarchical data line structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A structure for a charge coupled device (CCD) to minimize effects of masking defects of a predetermined dimensional extent, the structure comprising:

a plurality of sets of conductors, each set of conductors including a plurality of parallel elongate first conductors oriented in a first direction and disposed substantially in a first plane, each first conductor being comprised of a first material and characterized by a first sheet resistance per square of conductor; and at least one strapping network, each strapping network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance, wherein the plurality of sets of conductors includes at least a first set and a second set, each of the first and second sets of conductors including at least a first phase conductor, wherein the at least one strapping network includes a first strapping network, wherein the plurality of second conductors of the first strapping network includes at least a first strap conductor, wherein the first strap conductor of the first strapping network is connected to the first phase conductor of the first set and not connected to the first phase conductor of the second set.

2. The structure of claim 1, wherein:

the plurality of second conductors of the first strapping network further includes a second strap conductor; and the second strap conductor of the first strapping network is connected to the first phase conductor of the second set and not connected to the first phase conductor of the first set.

3. The structure of claim 2, wherein:

the at least one strapping network further includes a second strapping network, the second strapping network being electrically distinct from the first strapping network, the plurality of second conductors of the second strapping network including at least a first strap conductor;

each of the first and second sets of conductors further includes a second phase conductor; and the first strap conductor of the second strapping network is connected to the second phase conductor of the first set and not connected to the second phase conductor of the second set.

4. The structure of claim 3, wherein:

the plurality of second conductors of the second strapping network further includes a second strap conductor; and the second strap conductor of the second strapping network is connected to the second phase conductor of the second set and not connected to the second phase conductor of the first set.

5. The structure of claim 3, wherein:

the plurality of sets of conductors further includes a third set, the third set being disposed between the first and second sets; and a lateral space between the first phase conductor of the first set and the first phase conductor of the second set is greater than the predetermined dimensional extent.

6. The structure of claim 2, wherein:

the at least one strapping network further includes a second strapping network, the second strapping network being electrically distinct from the first strapping network, the plurality of second conductors of the second strapping network including at least a first strap conductor;

each of the first and second sets of conductors further includes a second phase conductor; and the second phase conductor of the first set is connected to the first strap conductor of the second strapping network and not connected to the second strap conductor of the second strapping network.

7. The structure of claim 6, wherein:

the plurality of second conductors of the second strapping network further includes a second strap conductor; and the second phase conductor of the second set is connected to the second strap conductor of the second strapping network and not connected to the first strap conductor of the second strapping network.

8. The structure of claim 2, wherein:

the plurality of second conductors of the first strapping network includes a third strap conductor disposed between the first and second strap conductors of the first strapping network; and a lateral space between the first and second strap conductors of the first strapping network is greater than the predetermined dimensional extent.

9. The structure of claim 1, wherein the at least one strapping network further includes a second strapping network, the second strapping network being electrically distinct from the first strapping network, a lateral space between the first and second strapping networks being greater than the predetermined dimensional extent.

10. The structure of claim 1, wherein the at least one strapping network includes a strapping network formed according to a redundant masking and etching process.

11. A structure for a charge coupled device (CCD) to minimize effects of masking defects of a predetermined dimensional extent, the structure comprising:

at least one set of conductors, each set of conductors including a plurality of parallel elongate first conductors oriented in a first direction and disposed substantially in a first plane, each first conductor being comprised of a first material and characterized by a first sheet resistance per square of conductor; and a plurality of strapping networks, each network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance, wherein the at least one set of conductors includes a first set, the first set of conductors including at least a first phase conductor, wherein the plurality of strapping networks includes at least a first strapping network and a second strapping network, the second strapping network being electrically distinct from the first strapping network, wherein the plurality of second conductors of the first strapping network includes at least a first strap conductor of the first strapping network, wherein the plurality of second conductors of the second strapping network includes at least a first strap conductor of the second strapping network, wherein the first phase conductor of the first set is connected to the first strap conductor of the first strapping network and not connected to the first strap conductor of the second strapping network.

12. The structure of claim 11, wherein:

the first set of conductors further includes a second phase conductor; and the second phase conductor of the first set is connected to the first strap conductor of the second strapping network and not connected to the first strap conductor of the first strapping network.

13. The structure of claim 11, wherein:

the plurality of second conductors of the first strapping network further includes a second strap conductor; and the second strap conductor of the first strapping network is connected to the first phase conductor of the second set and not connected to the first phase conductor of the first set.

14. The structure of claim 13, wherein:

the plurality of second conductors of the first strapping network includes a third strap conductor disposed between the first and second strap conductors of the first strapping network; and a lateral space between the first and second strap conductors of the first strapping network is greater than the predetermined dimensional extent.

15. The structure of claim 11, wherein:

the at least one set of conductors further includes a second set, the second set of conductors including at least a first phase conductors; and the first phase conductor of the second set is unconnected to the first strap conductor of the first strapping network and unconnected to the first strap conductor of the second strapping network.

16. The structure of claim 15, wherein:

the at least one set of conductors further includes a third set, the third set being disposed between the first and second sets; and a lateral space between the first phase conductor of the first set and the first phase conductor of the second set is greater than the predetermined dimensional extent.

17. The structure of claim 11, wherein a lateral space between the first and second strapping networks is greater than the predetermined dimensional extent.

18. The structure of claim 11, wherein the plurality of strapping networks includes a plurality of strapping networks formed according to a redundant masking and etching process.

19. A structure for a charge coupled device (CCD) to minimize effects of masking defects of a predetermined dimensional extent, the structure comprising:

at least one set of conductors, each set of conductors including a plurality of parallel elongate first conductors oriented in a first direction and disposed substantially in a first plane, each first conductor being comprised of a first material and characterized by a first sheet resistance per square of conductor; and a plurality of strapping networks, each network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance, wherein the plurality of strapping networks includes at least a first strapping network and a second strapping network, the second strapping network being electrically distinct from the first strapping network, a lateral space between the first and second strapping networks being greater than the predetermined dimensional extent.

20. The structure of claim 19, wherein the plurality of strapping networks includes a plurality of strapping networks formed according to a redundant masking and etching process.

21. A structure for a charge coupled device (CCD) to minimize effects of masking defects of a predetermined dimensional extent, the structure comprising:

a plurality of sets of conductors, each set of conductors including a plurality of parallel elongate first conductors oriented in a first direction and disposed substantially in a first plane, each first conductor being comprised of a first material and characterized by a first sheet resistance per square of conductor; and at least one strapping network, each network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance, wherein the plurality of sets of conductors includes first, second and third sets, the third set being disposed between the first and second sets, the first and second sets of conductors including at least a first phase conductor; and a lateral space between the first phase conductor of the first set and the first phase conductor of the second set is greater than the predetermined dimensional extent.

22. The structure of claim 21, wherein the at least one strapping network includes a strapping network formed according to a redundant masking and etching process.

23. A structure for a charge coupled device (CCD) to minimize effects of masking defects of a predetermined dimensional extent, the structure comprising:

at least one set of conductors, each set of conductors including a plurality of parallel elongate first conductors oriented in a first direction and disposed substantially in a first plane, each first conductor being comprised of a first material and characterized by a first sheet resistance per square of conductor; and at least one strapping network, each network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance, wherein the at least one strapping network includes a first strapping network, wherein the plurality of second conductors of the first strapping network includes at least first, second and third strap conductors, the third strap conductor being disposed between the first and second strap conductors, wherein a lateral space between the first and second strap conductors of the first strapping network is greater than the predetermined dimensional extent.

24. The structure of claim 23, wherein the at least one strapping network includes a strapping network formed according to a redundant masking and etching process.

25. A structure for a charge coupled device (CCD) to minimize effects of masking defects of a predetermined dimensional extent, the structure comprising:

a plurality of sets of conductors, each set of conductors including a plurality of parallel elongate first conductors oriented in a first direction and disposed substantially in a first plane, each first conductor being comprised of a first material and characterized by a first sheet resistance per square of conductor;

a plurality of strapping networks, each network comprising a plurality of parallel elongate second conductors oriented in a second direction transverse to the first direction and being disposed substantially in a second plane insulatively spaced apart from the first plane, each second conductor being comprised of a second material and characterized by a second sheet resistance per square of conductor, the second sheet resistance being less than the first sheet resistance; and a connection matrix of via contacts, each via contact connecting a conductor of the plurality of first conductors of one of the sets of conductors with a conductor of the plurality of second conductors of one of the strapping networks, the connection matrix having a first via contact, distances between the first via contact and each other via contact of the connection matrix being greater than the predetermined dimensional extent, wherein a first lateral spacing between adjacent conductors of the plurality of first conductors is less than the predetermined dimensional extent, wherein a second lateral spacing between adjacent conductors of the plurality of second conductors is less than the predetermined dimensional extent.

26. The structure of claim 25, wherein the plurality of strapping networks includes a plurality of strapping networks formed according to a redundant masking and etching process.

* * * * *